(12) United States Patent
Ichimori et al.

(10) Patent No.: US 6,274,470 B1
(45) Date of Patent: Aug. 14, 2001

(54) METHOD FOR FABRICATING A SEMICONDUCTOR DEVICE HAVING A METALLIC SILICIDE LAYER

(75) Inventors: Takashi Ichimori; Norio Hirashita, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/615,706

(22) Filed: Jul. 13, 2000

(30) Foreign Application Priority Data

Nov. 26, 1999 (JP) .................................................. 11-335358

(51) Int. Cl.⁷ ............................................... H01L 21/3205
(52) U.S. Cl. ........................ 438/592; 438/655; 438/664
(58) Field of Search .................................. 438/592, 652, 438/655, 656, 664, 683

(56) References Cited

U.S. PATENT DOCUMENTS

| 5,593,924 | 1/1997 | Apte et al. . |
| 5,970,370 | * 10/1999 | Besser et al. ........................ 438/664 |
| 6,074,921 | * 6/2000 | Lin ........................................ 438/592 |
| 6,110,789 | * 8/2000 | Rhodes et al. ...................... 438/592 |

FOREIGN PATENT DOCUMENTS

| 4-303944 | * 10/1992 | (JP) . |
| 9-69497 | 3/1997 | (JP) . |
| 10-45416 | 2/1998 | (JP) . |
| 10-83971 | 3/1998 | (JP) . |

\* cited by examiner

*Primary Examiner*—Chandra Chaudhari
(74) *Attorney, Agent, or Firm*—Jones Volentine, PLLC

(57) ABSTRACT

A protective layer is formed on a metallic silicide layer prior to a heat treatment for reducing a resistance of the metallic silicide layer. As a result, vertical growing of crystallization in the metallic silicide layer is restrained by the protective layer during the heat treatment. Moreover, the crystallization in the metallic silicide layer easily grows along the protective layer. Therefore, evenness of the metallic silicide layer can be maintained.

8 Claims, 9 Drawing Sheets

METHOD FOR FABRICATING A SEMICONDUCTOR DEVICE HAVING A METALLIC SILICIDE LAYER

The present application claiming priority under 35 U.S.C. §119 to Japanese Application No. 11-335358 filed on Nov. 26, 1999, which is hereby incorporated by reference in its entirely for all purposes.

BACKGROUND OF THE INVENTION

1. Field of the Invention

The present invention relates to a method for fabricating a semiconductor device which has a metallic silicide layer.

2. Description of the Related Art

In a method for fabricating a semiconductor process, a metallic silicide layer is used for a gate electrode, an active region or conductive line in order to lower resistance.

A self-aligned silicide (SALICIDE) method is well known as a method for forming the metallic silicide layer. In the SAUCIDE method, first a metallic layer, such as a cobalt layer is formed on a substrate, and then plural heat treatments are carried out. Generally, a first heat treatment is for forming a metallic silicide in a surface of the substrate by diffusing a material of the metallic layer into the substrate. Other heat treatments are for reducing a resistance of the metallic silicide layer. Thereby, the metallic silicide layer can be formed in predetermined portions in the substrate by a self-aligned method.

Such SALICIDE method is disclosed in Japanese Laid-Open Patent Publication:HEI10-45416, published on Feb. 17, 1998. An outline of the process in the publication is shown in FIGS. 7(A)–(D). The corresponding method for forming a cobalt silicide layer is described hereinafter.

Active regions 103a and 103b, a gate electrode 105, side walls 107 which are formed on the sides of the gate electrode 105 and a field insulating layer 109 are formed on a semiconductor substrate 101, as shown in FIG. 7(A). These elements are defined as abase 111.

A cobalt layer 113 is formed on the base 111 by a sputtering method, as shown in FIG. 7(B).

Then, a first heat treatment is carried out That is, the base 111 on which the cobalt layer 113 is formed, is heated to a temperature within a range of 450° C.~500° C. by alamp anneal, as shown in FIG. 7(C). Thereby, cobalt sihicide layers are formed in interface surfaces. The cobalt silicide layers 115a, 115b, 115c are respectively formed on the interface surfaces between the cobalt layer 113 and the active regions 103a, 103b and the gate electrode 105. Such cobalt silicide layers 115a, 115b, 115c are composed of a CoSi layer which has a composition ratio of cobalt and silicon that is 1:1 or a $Co_2Si$ layer which includes more cobalt than silicon. So, resistivity of the cobalt silicide layers 115a, 115b, 115c is high.

Then, the cobalt layer 113 on the semiconductor substrate 101 is removed by a wet-etching method, as shown in FIG. 7(D).

Then, a second heat treatment is carried out. That is, the cobalt silicide layers 115a, 115b and 115c are heated to a temperature within a range of 650° C.~900° C. by the lamp anneal. This temperature is higher than that of the first heat treatment. Thereby, the CoSi layer or the $Co_2Si$ layer of the cobalt silicide layers 115a, 115b and 115c are changed into a $CoSi_2$ layers. Therefore, as resistivity of the cobalt silicide layers 115a, 115b, 115c become low, resistance of the gate electrode 105 and the active regions 103a, 103b can be reduced.

However, in such a method, crystallization of $Co_2Si$ in the cobalt silicide layers partially grows up during the second heat treatment which is carried out at the high temperature. That is, after the second heat treatment for reducing the resistance, large crystallization partially exists in the cobalt silicide layers. As a result, evenness of the cobalt silicide layers is markedly deformed.

FIG. 8(A) and FIG. 8(B) illustrate an outline of the unevenness of the cobalt silicon layers. FIG. 8(A) shows the cobalt silicide layers after the second heat treatment. FIG. 8(B) shows contacting holes which are formed in an intermediate insulating layer on the cobalt silicide layers after the second heat treatment.

As shown in FIG. 8(A), evenness of the cobalt silicide layers is deformed by the large crystallization which is formed by the second heat treatment. That is, surfaces of the cobalt silicide layers 119a, 119c and interfaces between the cobalt silicide layer 119a and the active regions 103a are uneven. A dip 121 in which the surface of the cobalt silicide layer 119a sags partially, a discontinuous portion 123 in which the surface of the cobalt silicide layer 119c is partially disconnected, and a coarse large crystallization 125 which reaches to the substrate 101 through the active region 103a by growing of the large crystallization are shown in FIG. 8(A). The coarse large crystallization 125 causes a leakage current between the substrate 101 and a conductive line which is formed thereafter.

Generally, contacting holes 129 are formed in an intermediate insulating layer 127 on the cobalt silicide layers. If the contact hole 129 is formed on the dip 121, the substrate 101 is over-etched by an etching process which is used for the contacting hole 129. Therefore, a leakage current between the substrate 101 and a conductive line which is formed in the contacting hole 129 occurs. Further, as the discontinuous portion 123 increases a resistance, a defective connection to the contacting hole results.

Such effects are not limited to cobalt silicide layers, but also occur when metals, such as platinum or titanium are used for forming a metallic silicide. In particular, in the case where a silicon on insulator (SOI) substrate which has an insulating film and a thin silicon film formed on a substrate is used as the substrate, the thin silicon film is very thin. The thin silicon film is easily over-etched while forming the contacting holes, resulting in a defective connection at the contacting hole and a leakage current.

Thus, in the conventional method for forming the metallic silicide layer, as evenness of the metallic silicide layer is deformed, leakage current and defective connections become considerable problems.

SUMMARY OF THE INVENTION

An object of the invention is to provide a method for fabricating a semiconductor device having a metallic silicide layer, which prevents deforming of evenness of the metallic silicide layer.

To achieve this object, in a preferred embodiment of the invention, a protective layer is formed on the metallic silicide layer prior to a heat treatment for reducing a resistance of the metallic silicide layer.

According to the present invention, vertical growing of crystallization in the metallic silicide layer is restrained by the protective layer during the heat treatment. Moreover the crystallization in the metallic silicide layer is easy to grow along the protective layer. Therefore, evenness of the metallic suicide layer can be maintained. As a result, the leakage current and defective connections can be avoided and an unevenness of resistivity of the metallic silicide layer can be reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a MOS transistor.

A first preferred embodiment will be described hereinafter referring to FIG. 1(A) to FIG. 1(F).

Figure 1A:
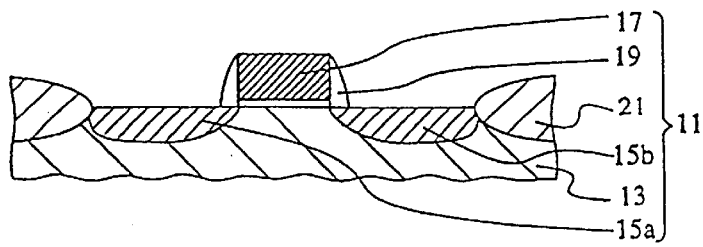
FIG.1(A)–FIG. 1(F) are cross-sectional views describing a method of fabricating a semiconductor device according to a first preferred embodiment.

Active regions 15a and 15b, a gate electrode 17, side walls 19 which are formed on the sides of the gate electrode 17 and a field insulating layer 21 which partitions the MOS transistor, are formed on a semiconductor substrate 13, as shown in FIG. 1(A). These elements are defined as a base 11. The gate electrode 17 is comprised of a polycrystalline silicon and is formed on the substrate 13 through a gate insulating film.

Figure 1B:
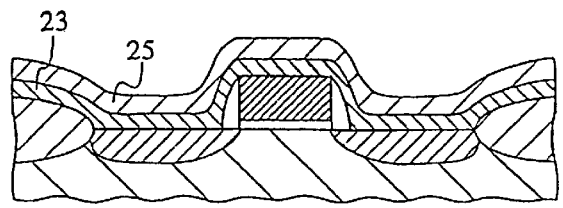

As shown in FIG. 1(B), a cobalt layer 23 for forming a metallic silicide layer is formed on the base 11. Here, it is desirable to form a protection layer 25 on the cobalt layer 23 in order to protect the cobalt layer 23 from oxidation dung a heat treatment described hereinafter. A titanium layer or a titanium nitride layer is used as the protection layer 25. If the titanium layer or the titanium nitride layer is used, this layer and the cobalt layer 23 are simultaneously removed by a wet etching in a later process.

Figure 1C:
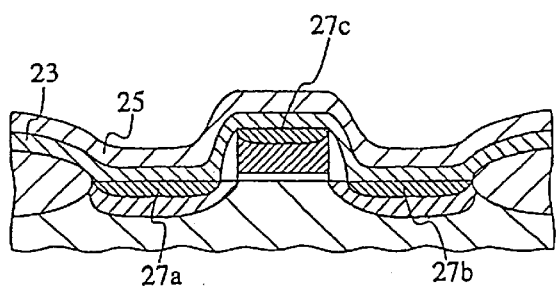

Then, a first heat treatment is carried out. That is, the base 11 on which the cobalt layer 23 is formed, is heated to a temperature within a range of 400° C.~600° C. by a lamp anneal Thereby, cobalt silicide layers 27a, 27b, 27c are formed in interface surfaces. The cobalt silicide layers 27a, 27b, 27c are respectively formed on the interface surfaces between the cobalt layers 23 and the active regions 15a, 15b and the gate electrode 17, as shown in FIG. 1(C). Such cobalt silicide layers 27a, 27b, 27c (CoxSi; $X \geq 1$) are composed of a CoSi layer which has a composition ratio of cobalt and silicon that is 1:1 or a $Co_2Si$ layer which includes more cobalt than silicon.

Figure 1D:
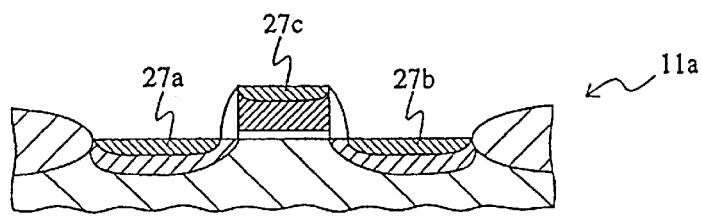

Then, the cobalt layer 23 and the protection layer 25 are simultaneously removed by a wet etching method, such as an aqueous ammonia, as shown in FIG. 1(D). This structure is defined as abase 11a.

Figure 1E:
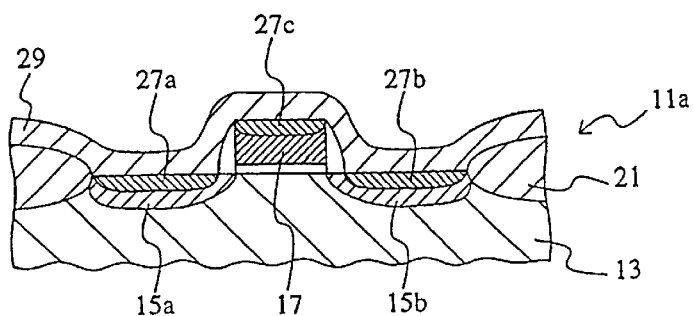
Figure 1F:
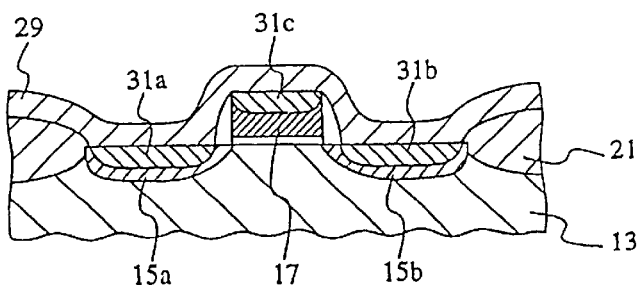

Then, a protective layer, in this embodiment a silicon oxide layer 29, is formed on the base lha including the cobalt silicide layer 27a, 27b, 27c, as shown in FIG. 1(E). This silicon oxide layer 29 at least covers the cobalt silicide layers 27a, 27b, 27c and contacts with surfaces thereof In this embodiment, a thickness of the silicon oxide layer 29 is 200 Å. The protective layer is not limited to an insulating layer, such as the silicon oxide layer, but any layer which does not react with the metallic silicide, such as the cobalt silicide layer, can be used Then, a second heat treatment is carried out. That is, the cobalt silicide layers 27a, 27b and 27c are heated at a temperature of 700° C. or more for 30 seconds by the lamp anneal. This temperature is higher than that of the first heat treatment. Thereby, the CoxSi layer (such as the CoSi layer and the $Co_2Si$ layer) of the cobalt silicide layers 27a, 27b and 27c are changed to $CoSi_2$ layers 31a, 31b and 31c, as shown in FIG. 1(F). Therefore, as resistivity of the cobalt silicide layers becomes low, resistance of the gate electrode 17 and the active regions 15a, 15b can be reduced.

This second heat treatment is carried out with the cobalt silicide layer 27a, 27b, 27c covered by the silicon oxide layer 29. So, crystallization of $CoSi_2$ grows along the silicon oxide layer 29 at interfaces between the cobalt silicide layers 27a, 27b, 27c and the silicon oxide layer 29. That is, the crystallization of $CoSi_2$ grows in a direction parallel with the extending direction of the silicon oxide layer 29. Further, crystallization of $CoSi_2$ easily grows in a direction parallel with the extending direction of the silicon oxide layer 29 at interfaces between the cobalt silicide layers 27a, 27b, 27c and the active regions 15a, 15b and the gate electrode 17. Therefore, evenness of the cobalt silicide layer can be maintained after the second heat treatment After that, the silicon oxide layer 29 may be removed However, if the silicon oxide layer 29 is desirable to be used as an intermediate insulating layer, the layer 29 may not be removed. This second heat treatment is only called the second heat treatment for sake of convenience. Actually, the second heat treatment may be any heat treatment for the transition of the metallic silicide layer formed on the semiconductor substrate in order to cause the resistance of the metallic silicide layer to be lower.

According to the first preferred embodiment, as the crystallization of $CoSi_2$ mainly grows in a direction parallel with the extending direction of the silicon oxide layer, that is the extending direction of the active regions along the substrate, the vertical crystallization growth of $CoSi_2$ is difficult. Therefore, as a coarse large crystallization which reaches to the substrate through the active regions is restrained from growing, leakage current between the substrate and the active regions can be reduced As crystallization of the metallic gilicide layer grows in a direction parallel with the extending direction of the protective layer during the second heat treatment, evenness of the metallic silicide layer can be maintained after the second heat treatment. So, leakage current between the substrate and the conductive line in the contacting holes which is caused by the over etching can be reduced. Also, an unevenness of resistivity of the metallic silicide layer can be reduced. Further, as the discontinuous portion is prevented from forming, an increasing of the resistance at the contacting holes can be restrained.

Such effects are not limited to the cobalt silicide layers, but also occur when metals are used for forming a metallic silicide, such as platinum or titanium.

Figure 2A:
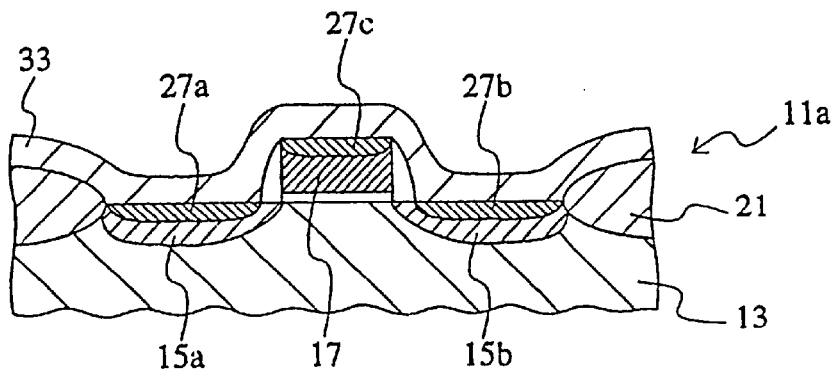
FIG. 2(A)–FIG. 2(C) are cross-sectional views describing a method of fabricating a semiconductor device according to a second preferred embodiment.
Figure 2B:
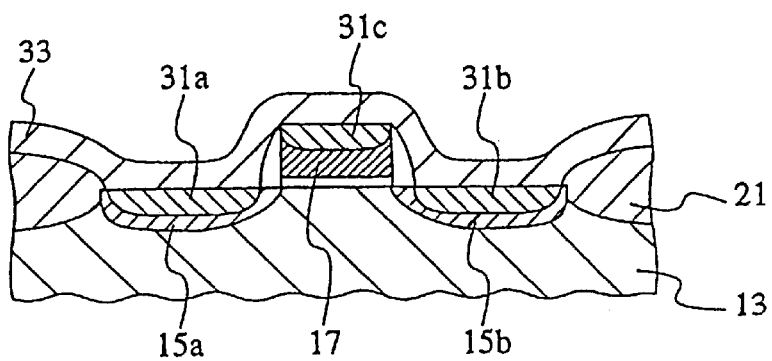
Figure 2C:
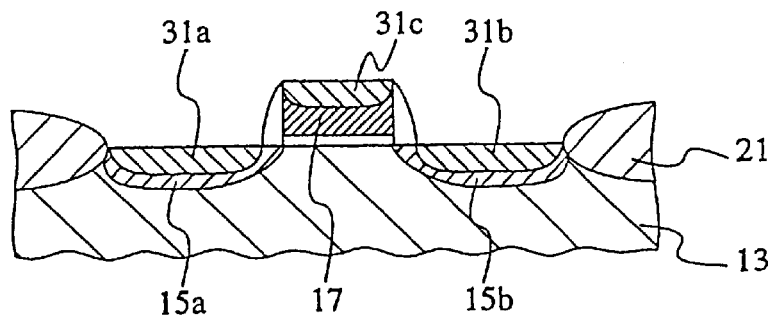

FIG. 2(A)–FIG. 2(C) are cross-sectional views describing a method of fabricating a semiconductor device according to a second preferred embodiment. In this embodiment, elements which correspond to the elements of the first preferred embodiment are marked with the same symbols to facilitate understanding. Before the step of FIG. 2(A), steps similar to those of FIG. 1(A)–FIG. 1(D) are carried out.

Then, the protective layer, in this embodiment a titanium nitride layer 33, is formed on the base 11a including the cobalt silicide layer (CoxSi:x≧1) 27a, 27b, 27c, as shown in FIG. 2(A). This titanium nitride layer 33 at least covers the cobalt silicide layers 27a, 27b, 27c and contacts with surfaces thereof. In this embodiment, a thickness of the titanium nitride layer 33 is 200 Å. The titanium nitride layer 33 is formed by which a titanium layer is heated in an atmosphere of nitride. The protective layer is not limited to titanium nitride, but any conducive layer which does not react with the metallic silicide can be used.

Similarly, a second heat treatment is carried out. That is, the cobalt silicide layers 27a, 27b and 27c are heated at a temperature of 700° C. or more for 30 seconds by the lamp anneal. Thereby, the CoxSi of the cobalt silicide layers 27a, 27b and 27c layer change to $CoSi_2$ layers 31a, 31b and 31c, as shown in FIG. 2(B). Therefore, as resistivity of the cobalt silicide layers become low.

Similar to the first embodiment, this second heat treatment is carried out with the cobalt silicide layer 27a, 27b, 27c covered by the titanium nitride layer 33. So, crystallization of $CoSi_2$ grows along the titanium nitride layer 33 at interfaces between the cobalt silicide layers 27a, 27b, 27c and the titanium nitride layer 33. That is, the crystallization of $CoSi_2$ grows in a direction parallel with the extending direction of the titanium nitride layer 33. Further, crystallization of $CoSi_2$ grows easily in a direction parallel with the extending direction of the titanium nitride layer 33 at interfaces between the cobalt silicide layers 27a, 27b, 27c and the active regions 15a, 15b and the gate electrode 17. Therefore, evenness of the cobalt silicide layer can be maintained after the second heat treatment.

After that, the titanium nitride layer 33 is removed by a wet etching method, as shown in FIG. 2(C). For example, the titanium nitride layer 33 is selectively removed by sulfuric acid.

According to the second preferred embodiment, as the crystallization of $CoSi_2$ mainly grows in a direction parallel with the extending direction of the silicon oxide layer, that is the extending of the active regions along the substrate, the vertical crystallization growth of $CoSi_2$ is difficult. Therefore, as a coarse large crystallization which reaches to the substrate through the active regions is restrained from growing, a leakage current between the substrate and the active regions can be reduced As crystallization of the metallic silicide layer grows in a direction parallel with the extending direction of the protective layer during the second heat treatment, evenness of the metallic silicide layer can be maintained after the second heat treatment. So, leakage current between the substrate and the conductive line in the contacting holes which is caused by the over etching can be reduced Also, an unevenness of resistivity of the metallic silicide layer can be reduced.

Further, as the discontinuous portion is prevented from forming, an increasing of the resistance at the contacting holes can be restrained Such effects are not limited to the cobalt silicide layers, but also occur when metals are used for forming a metallic silicide, such as platinum or titanium.

Figure 3:
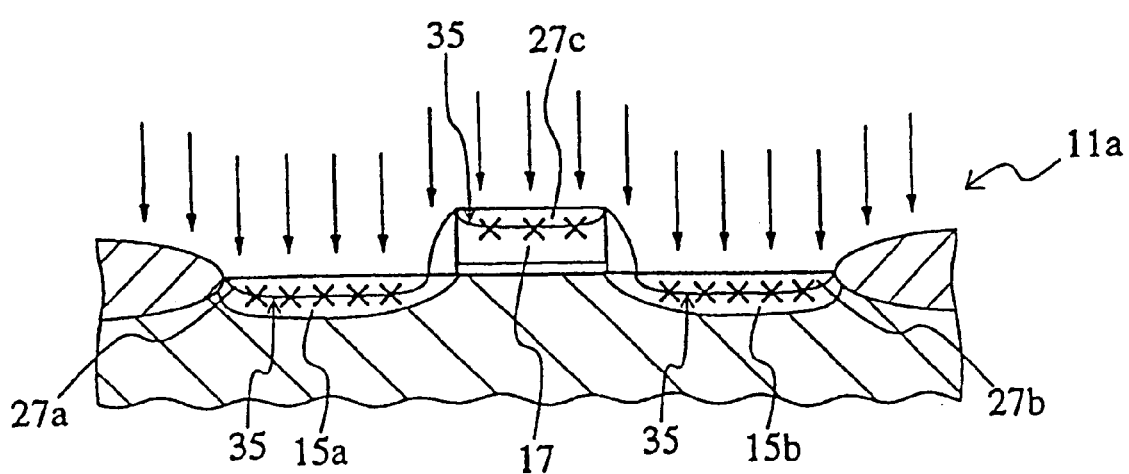
FIG. 3 is a cross-sectional view describing a method of fabricating a semiconductor device according to a third preferred embodiment.

FIG. 3 is a cross-sectional view describing a method of fabricating a semiconductor device according to a third preferred embodiment. In this embodiment, elements which correspond to the elements of the first and second preferred embodiments are marked with the same symbols to facilitate understanding. The step of this embodiment can be carried out before the second heat treatment and after forming the metallic silicide layer, that is, between the steps of FIG. 1(C) and FIG. 1(F) or FIG. 2(B). However, it is desirable to carry out this step between the steps of FIG. 1(D) and FIG. 1(E) since the base 11a is not covered by any layers.

In this embodiment, after the step of FIG. 1(D), ions are implanted into interfaces 35 between the cobalt silicide layers 27a, 27b, 27c and the active region 15a, 15b and the gate electrode 17. That is, the ions are provided to the interfaces 35 between the metallic silicide layers and silicon layers or the polycrystalline silicon. By implanting the ions, the interfaces 35 become amorphous. In this embodiment, the ions are implanted from above the base 11a.

Implanting of the ions causes a physical damage, such as a lattice defect along a range of the ions at the interfaces 35. Therefore, as the crystallization of $CoSi_2$ becomes small, a coarse large crystallization is restrained from growing during the second heat treatment. Ions of inert gas can be used as the ions and it is desirable to use argon because of minimizing cost.

According to this embodiment, besides the effects mentioned above, as the metallic silicide layers which are amorphous are exposed under the second heat treatment, a large crystallization of $CoSi_2$ is restrained from growing during the second heat treatment, compared with the first and second preferred embodiments.

FIG. 4(A)–FIG. 4(F) are cross-sectional views describing a method of fabricating a semiconductor device according to a fourth preferred embodiment In this embodiment, elements which correspond to the elements of the preferred embodiments mentioned above are marked with the same symbols to facilitate understanding. Before the step of FIG. 4(A), steps similar to those of FIG. 1(A)–FIG. 1(D) are carried out.

Figure 4A:
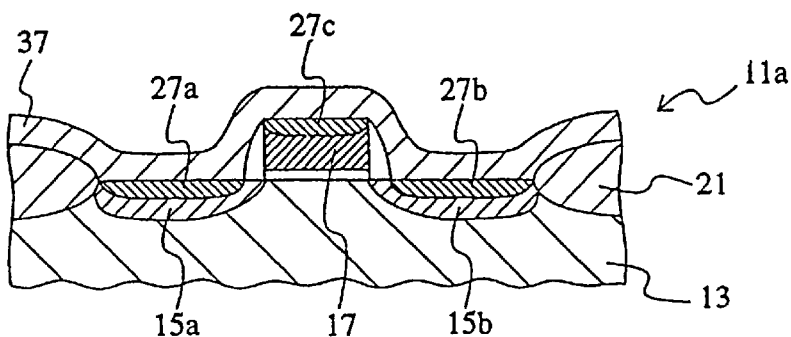
FIG. 4(A)–FIG. 4(F) are cross-sectional views describing a method of fabricating a semiconductor device according to a fourth preferred embodiment
Figure 4B:
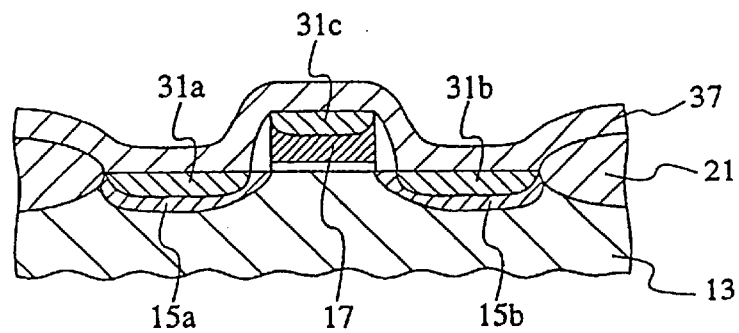

Then, a silicon oxide layer 37 is formed on the base 11a including the cobalt silicide layer 27a, 27b, 27c, as shown in FIG. 4(A). This silicon oxide layer 29 at least covers the cobalt silicide layers 27a, 27b, 27c and contacts with surfaces thereof A thickness of the silicon oxide layer 33 is 200 Å. The protective layer is not limited to the silicon oxide, but any insulating layer which does not react with the metallic silicide may be used Then, similar to the first embodiment, a second heat treatment is carried out, as shown in FIG. 4B).

Figure 4C:
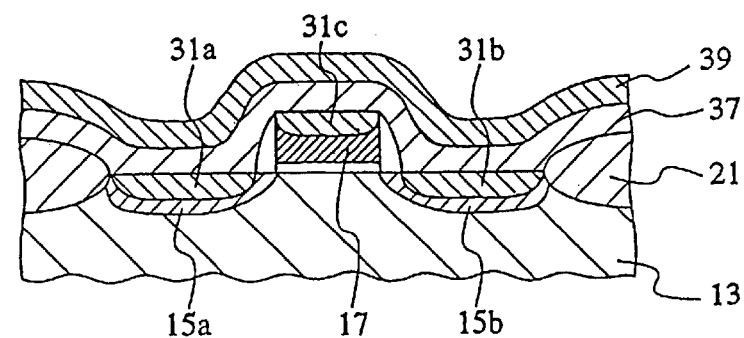

Then, a second insulating layer 39, in this embodiment a silicon nitride layer 39, is formed on the silicon oxide layer 37, as shown in FIG. 4(C). A thickness of the silicon nitride layer 39 is 200 Å.

In this embodiment, as the silicon nitride layer 39 is formed after the second heat treatment, elements in the base 11a do not receive heat stress from the silicon nitride layer 39 during the second heat treatment. Further, the silicon oxide layer 37 provides cushion between the stress of the silicon nitride layer 39 and the base 11a.

Figure 4D:
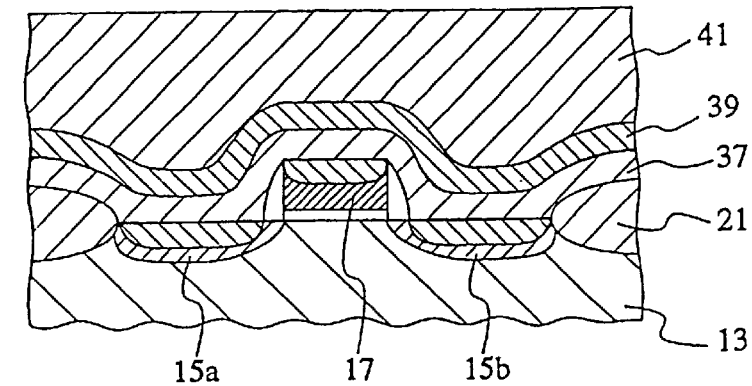

Then, an intermediate insulating layer 41 is formed on the silicon nitride layer 39. This insulating layer 41 is a phospho-silicate glass (PSG), as shown in FIG. 4(D).

Figure 4E:
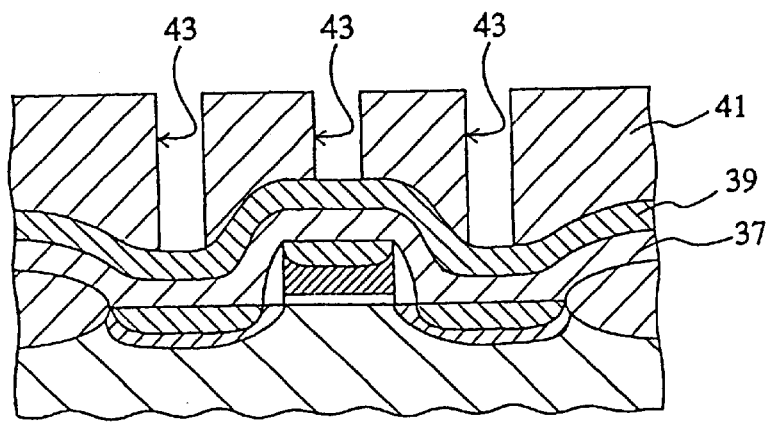

The insulating layer 41 is etched so as to expose portions of the silicon nitride layer 39, as shown in FIG. 4(E). Thereby, first contacting holes 43 which reach to the silicon nitride layer 39 from a surface of the insulating layer 41 are formed.

Figure 4F:
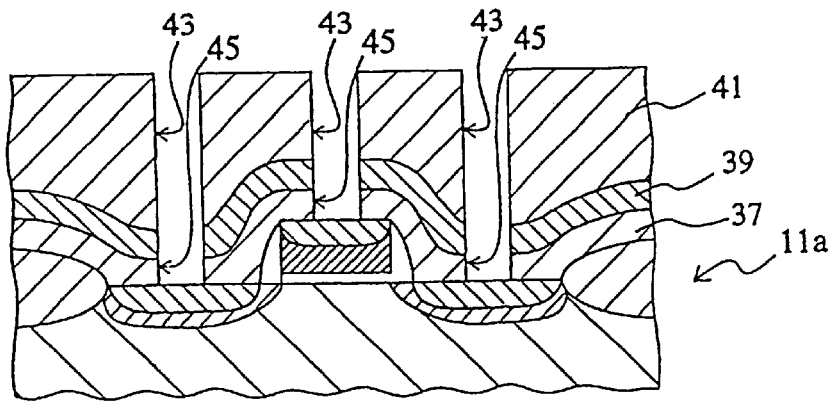

Then, the silicon nitride layer 39 and the silicon oxide layer 37 are etched so as to expose portions of the metallic silicide layers 31a, 31b, 31c, as shown in FIG. 4(F). Thereby, second contacting holes 45 which are continuous with the first contacting holes 43 reach to the metallic silicide layers 31a, 31b, 31c of the base 11a.

Generally, a thickness of an intermediate insulating layer is several thousand angstom. However, the thickness based on the configurations under the intermediate insulating layer are different at each portion. If contacting holes which reach to a substrate are formed by one etching process, over-etched portions which are under the insulating layer which is partially thin occurs. In this embodiment, as the silicon nitride layer 39 finctions as an etch stop, the insulating layer 41 can be just etched although having differences of thickness. That is, the contacting holes 43 which reach to the silicon nitride layer 39 are formed precisely. As the silicon nitride layer 39 and the silicon oxide layer 37 are thin, a remarkable difference of thickness does not occur. So, the etching process for the silicon nitride 39 and the silicon oxide 37 can be controlled by an etching period According to this embodiment, besides the effects mentioned above, as an over-etching can be restrained, a leakage current between the substrate and the active regions may be reduced.

Figure 5A:
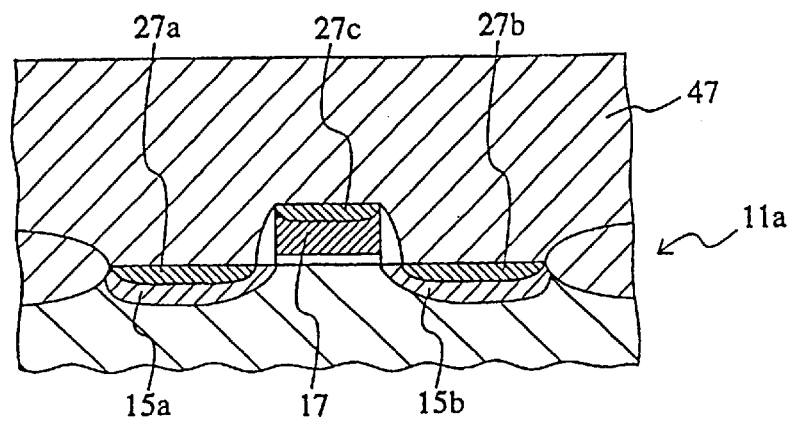
FIG. 5(A)–FIG. 5(C) are cross-sectional views describing a method of fabricating a semiconductor device according to a f preferred embodiment.
Figure 5B:
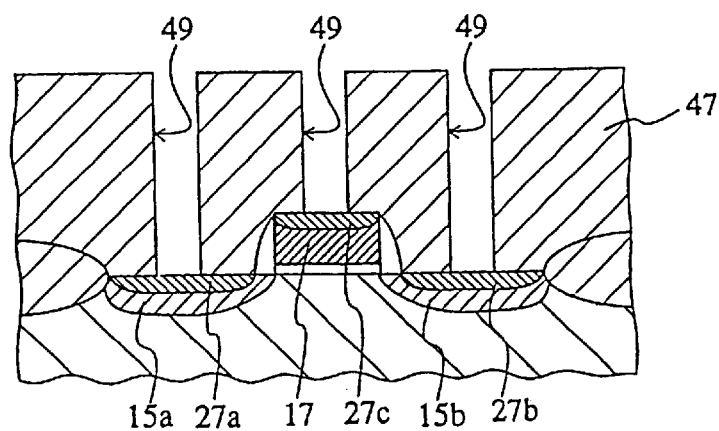
Figure 5C:
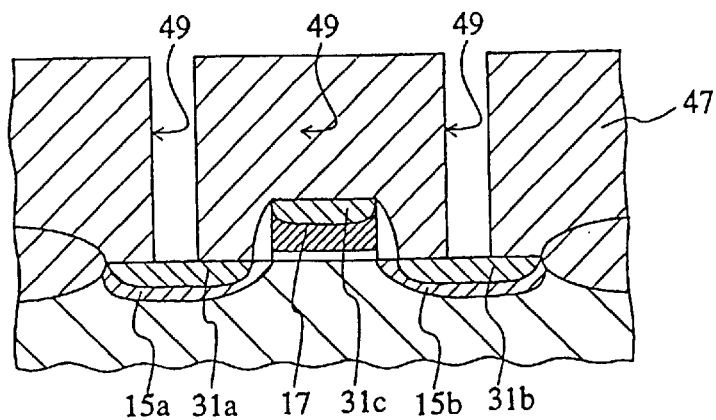

FIG. 5(A)–FIG. 5(C) are cross-sectional views describing a method of fabricating a semiconductor device according to a fifth preferred embodiment. In this embodiments, elements which correspond to the elements of the preferred embodiment mentioned above are marked with the same symbols to facilitate understanding. Before the step of FIG. 5(A), steps similar to those of FIG. 1(A)–FIG. 1(D) are carried out.

Then, an intermediate insulating layer 47 is formed on the base 11a including the cobalt silicide layer 27a, 27b, 27c, as shown in FIG. 5(A). This intermediate insulating layer 47 covers the cobalt silicide layers 27a, 27b, 27c and contacts with surfaces thereof. The intermediate insulating layer 47 is comprised of the PSG layer and its thickness is several thousand angstrom. The intermediate insulating layer is not limited to the PSG layer, but any insulating layer which does not react with the metallic silicide during the heat treatment can be used.

The insulating layer 47 is etched so as to expose portions of the cobalt silicide layers 27a, 27b, 27c, as shown in FIG. 5(B). Thereby, contacting holes 49 which reach to the base 11a from a surface of the insulating layer 47 are formed. The cobalt silicide layers (CoxSi) 27a, 27b, 27c are flatter than the cobalt silicide layers (CoSi$_2$) which are formed by the second heat treatment hereinafter. So, such etching process for the contacting holes can be carried out precisely while restraining the over-etching.

Then, similar to the first embodiment, the second heat treatment is carried out, as shown in FIG. 5(C).

According to this embodiment, besides the effects mentioned above, as the contacting holes are formed before the second heat treatment, the over-etching can be restrained. This is because the metallic silicide layers under the holes are flatter than the metallic silicide layers which are formed by the second heat treatment. Therefore, a leakage current between the substrate and the conductive material in the contacting holes may be reduced.

FIG. 6(A)–FIG. 6(D) are cross-sectional views describing a method of fabricating a semiconductor device according to a sixth preferred embodiment. In this embodiments, elements which correspond to the elements of the preferred embodiment mentioned above are marked with the same symbols to facilitate understanding. Before the step of FIG. 6(C), steps similar to those of FIG. 5(A)–FIG. 5(B) are carried out.

Figure 6A:
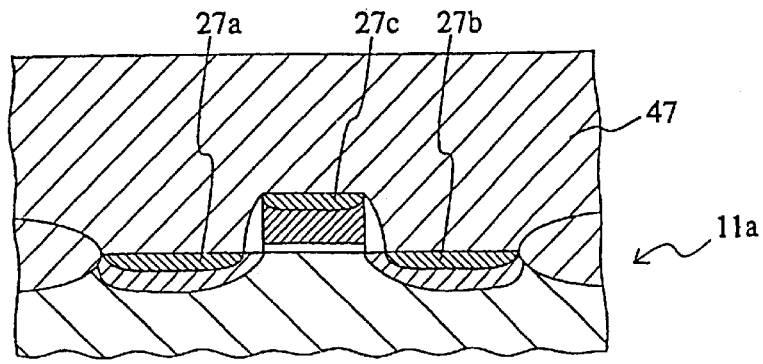
FIG. 6(A)–FIG. 6(D) are cross-sectional views describing a method of fabricating a semiconductor device according to a sixth preferred embodiment
Figure 6B:
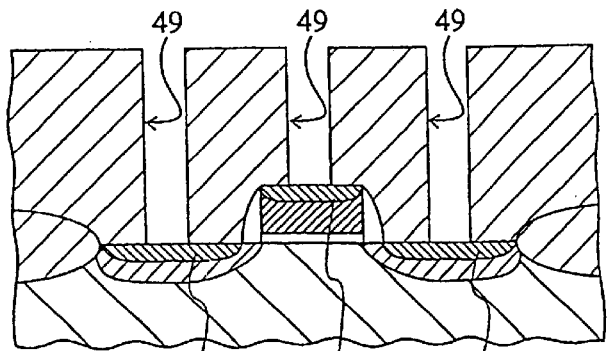
Figure 6C:
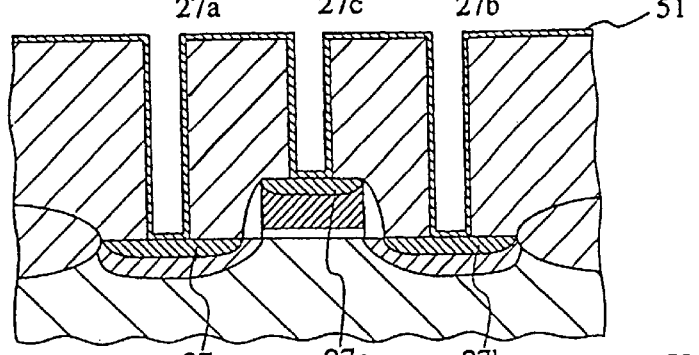

A pre-barrier metal layer 51 is formed on a surface of thle intermediate insulating layer 47 including interior surfaces of the contacting holes 49, as shown in FIG. 6(A). This pre-barrier metal layer 51 transforms to a barrier metal layer 53 by a heat treatment in an atmosphere of nitride or oxide hereinafter. The barrier metal layer 53 restrains from reacting between the conductive material in the contacting holes and the cobalt silicide layers 27a, 27b, 27c.

If the conductive material in the contacting holes is tungsten (W), titanium nitride (TiN) is desirable as the barrier metal 53. In this embodiment, the titanium nitride is used for the barrier metal 53 and titanium is used for the pre-barrier metal 51.

Figure 6D:
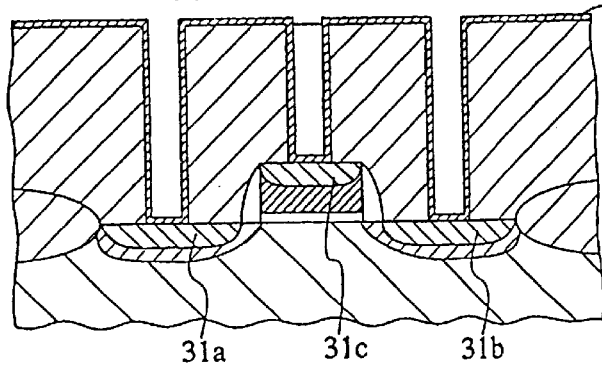
Figure 7A:
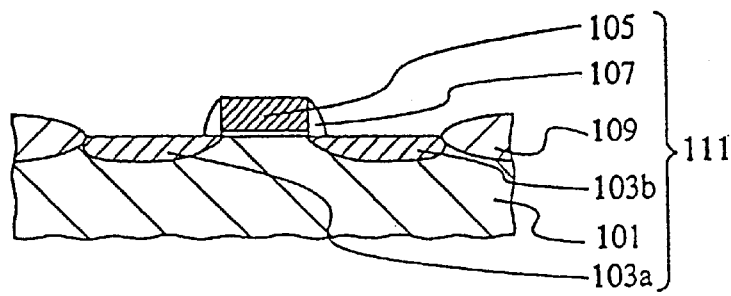
FIG. 7(A)–FIG. 7(D) are cross-sectional views describing a conventional method of fabricating a semiconductor device.
Figure 7B:
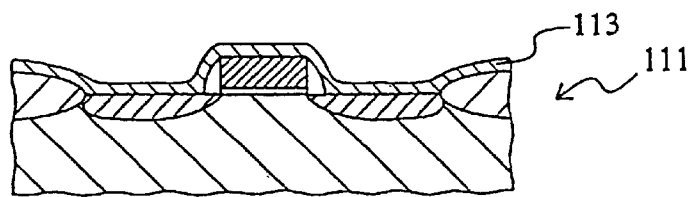
Figure 7C:
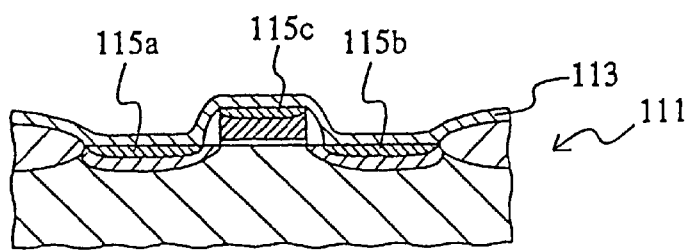
Figure 7D:
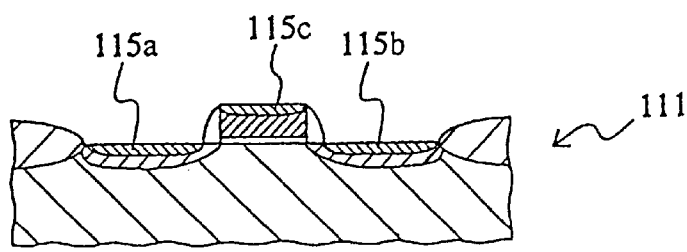
Figure 8A:
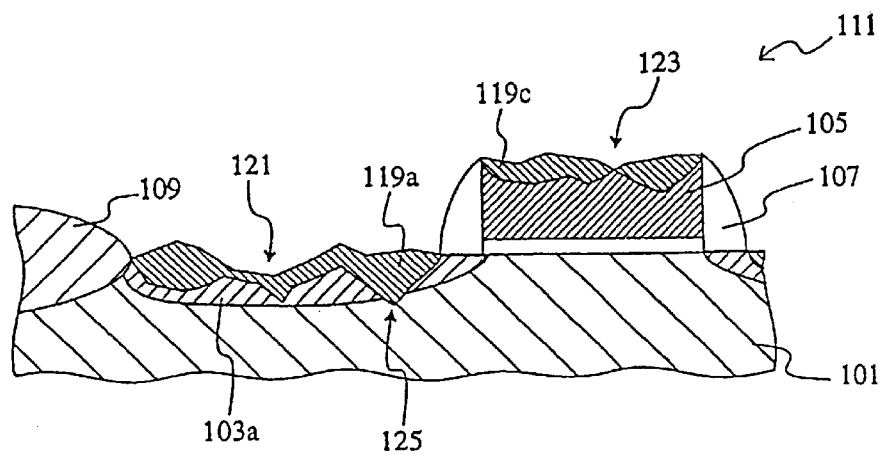
FIG. 8(A) and FIG. 8(B) are cross-sectional views of the conventional semiconductor device.
Figure 8B:
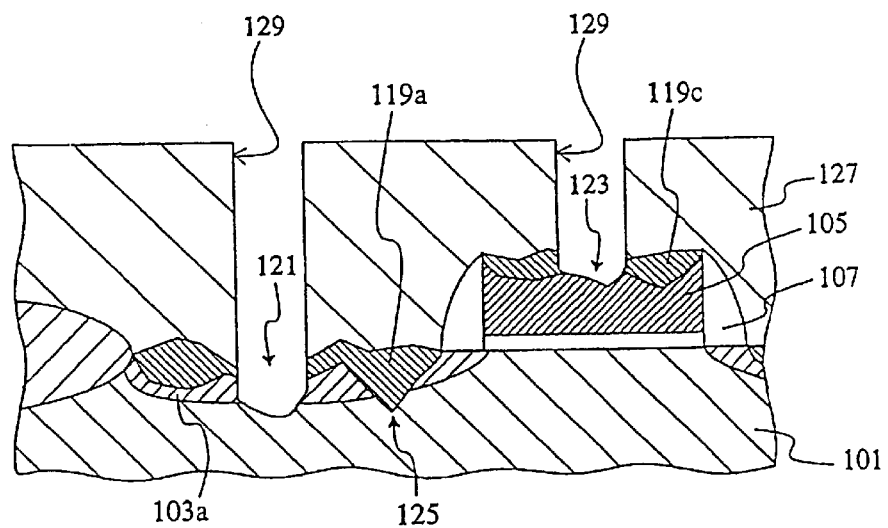

Then, a second heat treatment is carried out, as shown in FIG. 6(D). This heat treatment is carried out in the atmosphere of nitride. This heat treatment is for transforming both the metallic sllicide layers and the pre-barrier metal layer. That is, transforming of the metallic sihicide layers and forming the barrier metal layer can be simultaneously done in the same heat process. Similarly, the heat treatment is carried out at a temperature of 700° C. or more for 30 seconds. The pre-barrier metal layer 51 (titanium) transforms to the barrier metal 53 (titanium nitride) in this process.

According to this embodiment, besides the effects mentioned above, the barrier metal layer can be formed without increasing a heat treatment for forming the barrier metal layer.

Each embodiment mentioned above can be applied to a semiconductor device comprising of a SOI substrate. In particular, as a silicon film in which active regions are formed is very thin, the invention which can restrain the over-etching is effective. Thereby, defects in the device may be reduced.

The present invention has been described with reference to illustrative embodiments, however, this description must not be considered to be confined only to the embodiments illustrated Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A method for fabricating a semiconductor device, comprising:

providing a substrate which includes silicon;

forming a metallic layer on the substrate;

forming a metallic silicide layer in a surface of the substrate which contacts with the metallic layer by a first heat treatment;

removing the metallic layer on the metallic silicide layer;

forming a protective layer on the metallic silicide layer, wherein the protective layer is a first insulating layer;

lowering a resistance of the metallic silicide layer by a second heat treatment;

forming a second insulating layer on the first insulating layer;

forming a third insulating layer on the second insulating layer;

opening a first contacting hole in the third insulating layer so as to expose a portion of the second insulating layer; and opening a second contacting hole in the first and second insulating layers so as to expose a portion of the metallic silicide layer, wherein the second contacting hole is continuous with the first contacting hole.

2. The method according to claim 1, further comprising implanting ions into an interface between the metallic silicide layer and the substrate prior to the second heat treatment, to form an amorphous layer in the interface, wherein the ions are argon.

3. The method according to claim 1, further comprising opening a contacting hole in the protective layer so as to expose a portion of the metallic silicide layer before the second heat treatment.

4. The method according to claim 3, further comprising forming a barrier layer on an interior surface of the contacting hole.

5. A method for fabricating a semiconductor device, comprising:

providing a substrate which includes silicon;

forming a metallic sihicide layer in a surface of the substrate;

forming a protective layer on the metallic silicide layer, wherein the protective layer is a first insulating layer;

heat treating the metallic silicide layer which is covered by the protective layer at a high temperature;

forming a second insulating layer on the first insulating layer;

forming a third insulating layer on the second insulating layer;

opening a first contacting hole in the third insulating layer so as to expose a portion of the second insulating layer, and opening a second contacting hole in the first and second insulating layers so as to expose a portion of the metallic sihcide layer, wherein the second contacting hole is continuous with the first contacting hole.

6. The method according to claim 5, further comprising implanting ions into an interface between the metallic silicide layer and the substrate to form an amorphous layer in the interface, wherein the ions are argon.

7. The method according to claim 5, further comprising:

opening a contacting hole in the protective layer so as to expose a portion of the metallic silicide layer before the heat treating.

8. The method according to claim 7, further comprising forming a barrier layer on an interior surface of the contacting hole.

* * * * *